United States Patent
Koeck et al.

(10) Patent No.: US 9,922,791 B2
(45) Date of Patent: Mar. 20, 2018

(54) PHOSPHORUS DOPED DIAMOND ELECTRODE WITH TUNABLE LOW WORK FUNCTION FOR EMITTER AND COLLECTOR APPLICATIONS

(71) Applicant: Arizona Board of Regents on Behalf of Arizona State University, Scottsdale, AZ (US)

(72) Inventors: Franz A. M. Koeck, Tempe, AZ (US); Robert J. Nemanich, Scottsdale, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/588,362

(22) Filed: May 5, 2017

(65) Prior Publication Data

US 2017/0323756 A1  Nov. 9, 2017

Related U.S. Application Data

(60) Provisional application No. 62/332,338, filed on May 5, 2016.

(51) Int. Cl.
*H01J 45/00* (2006.01)
*H01J 19/30* (2006.01)
*H01J 9/04* (2006.01)
*H01J 9/14* (2006.01)
*H01J 19/06* (2006.01)
*C30B 25/18* (2006.01)
*C30B 25/20* (2006.01)
*C30B 25/16* (2006.01)
*C30B 29/04* (2006.01)

(52) U.S. Cl.
CPC ............. *H01J 19/30* (2013.01); *C30B 25/16* (2013.01); *C30B 25/186* (2013.01); *C30B 25/20* (2013.01); *C30B 29/04* (2013.01); *H01J 9/04* (2013.01); *H01J 9/14* (2013.01); *H01J 19/06* (2013.01); *H01J 45/00* (2013.01)

(58) Field of Classification Search
CPC .................................. H01J 45/00; H02N 3/00
See application file for complete search history.

(56) References Cited

U.S. PATENT DOCUMENTS

| | | |
|---|---|---|
| 4,752,713 A | 6/1988 | Buxbaum |
| 5,234,724 A | 8/1993 | Schmidt |
| 5,551,903 A | 9/1996 | Kumar et al. |

(Continued)

FOREIGN PATENT DOCUMENTS

| | | |
|---|---|---|
| EP | 2884525 A1 | 6/2015 |
| WO | 2014105085 A1 | 7/2014 |

OTHER PUBLICATIONS

Calvani et al., "Black diamond for solar energy conversion", Carbon 105 (2016) 401-407.*

(Continued)

*Primary Examiner* — Mariceli Santiago
(74) *Attorney, Agent, or Firm* — Quarles & Brady LLP

(57) ABSTRACT

An apparatus includes an emitter electrode including a phosphorus doped diamond layer with low work function. The apparatus further includes a collector electrode and a vacuum gap disposed between the emitter and the collector. The collector has a work function of 0.84 eV or less.

9 Claims, 6 Drawing Sheets

(56) References Cited

U.S. PATENT DOCUMENTS

| | | | |
|---|---|---|---|
| 5,578,886 A | 11/1996 | Homlid et al. | |
| 5,631,196 A | 5/1997 | Kane et al. | |
| 5,635,258 A | 6/1997 | Chen et al. | |
| 5,944,573 A | 8/1999 | Mearini et al. | |
| 5,961,717 A | 10/1999 | Kamo et al. | |
| 6,489,704 B1 | 12/2002 | Kucherov et al. | |
| 6,563,256 B1 | 5/2003 | Zavadil et al. | |
| 6,582,513 B1 | 6/2003 | Linares et al. | |
| 7,662,441 B2 | 2/2010 | Gicquel et al. | |
| 8,075,359 B2 | 12/2011 | Yamada et al. | |
| 8,188,456 B2 | 5/2012 | Nemanich et al. | |
| 8,277,622 B2 | 10/2012 | Scarsbrook | |
| 8,617,651 B2 | 12/2013 | Fox et al. | |
| 8,876,973 B2 | 11/2014 | Kato et al. | |
| 8,878,190 B2 | 11/2014 | Suzuki et al. | |
| 2003/0001490 A1 | 1/2003 | Yamamoto et al. | |
| 2005/0110024 A1 | 5/2005 | Swain | |
| 2007/0284255 A1 | 12/2007 | Gorokhovsky | |
| 2008/0042144 A1 | 2/2008 | Tatsumi et al. | |
| 2011/0017253 A1* | 1/2011 | Kataoka | H01J 45/00 136/205 |
| 2011/0139205 A1* | 6/2011 | Kimura | H01J 45/00 136/205 |
| 2012/0248550 A1 | 4/2012 | Huang et al. | |
| 2012/0135575 A1 | 5/2012 | Wong et al. | |
| 2014/0158179 A1* | 6/2014 | Kataoka | H01J 45/00 136/205 |
| 2015/0059974 A1 | 3/2015 | Boyd, Jr. | |
| 2015/0104648 A1 | 4/2015 | Wang | |
| 2015/0329989 A1 | 11/2015 | Konovalov | |
| 2015/0349060 A1 | 12/2015 | Suzuki et al. | |
| 2016/0043260 A1 | 2/2016 | Nemanich et al. | |

OTHER PUBLICATIONS

Baumann, P.K. "Surface cleaning, electronic states and electron affinity of diamond (100), (111) and (110) surfaces", Surface Science 409, pp. 320-355 (1998).

Corbella, C. et al., "Low friction and protective diamond-like carbon coatings deposited by asymmetric bipolar pulsed plasma", Diamond and Related Materials 18, pp. 1035-1038 (2009).

Dutta, M. et al., "P-i-n diodes enabled by homoepitaxially grown phosphorus doped diamond with breakdown electric field >1.25 MV/cm", 2015 73rd Annual Device Research Conference (DRC), Jun. 21-24, pp. 184—(2015).

Janssen, W. et al., "Substitutional phosphorus incorporation in nanocrystalline CVD diamond thin film", Phys. Status Solidi RRL 8, No. 8, 705-709 (2014).

Kato, H. et al., "Characterization of specific contact resistance on heavily phosphorus-doped diamond films", Diamond & Related Materials 18, pp. 782-785 (2009).

Kato, H. et al., "Heavily phosphorus-doped nano-crystalline diamond electrode for thermionic emission application", Diamond & Related Materials 63, pp. 165-168 (2016).

Kato, H. et al., "n-type diamond growth by phosphorus doping on (0 0 1)-oriented surface", J. Phys. D: Appl. Phys. 40, pp. 6189-6200 (2007).

Koeck, F.A.M. et al., "Substrate-diamond interface considerations for enhanced thermionic electron emission from nitrogen doped diamond films", J. Appl. Phys. 112, 113707 (2012).

Koeck, F.A.M. et al, "Low temperature onset for thermionic emitters based on nitrogen incorporated UNCD films", Diamond and Related Materials 12, pp. 232-234 (2009).

Koeck, F.A.M. et a;., "Thermionic electron emission from low work-function phosphorus doped diamond films", Diamond & Related Materials 18, pp. 789-791 (2009).

Koeck, F.A.M. et al., "Enhanced thermionic energy conversion and thermionic emission from doped diamond films through methane exposure", Diamond and Related Materials 20, pp. 1229-1233 (2011).

Koeck, F.A.M. et al., "Doped diamond thin film electron sources for thermionic energy conversion", 2013 26th International Vacuum Nanoelectronics Conference, Roanoke, VA, pp. 1-3 (2013).

Koizumi, S. et al., "Phosphorus-doped chemical vapor deposition of diamond", Diamond and Related Materials, 9, pp. 935-940 (2009).

Maida, O. et al., "Substrate temperature optimization for heavily-phosphorus-doped diamond films grown on vicinal (001) surfaces using high-power-density microwave-plasma chemical-vapor-deposition", Journal of Crystal Growth 424, pp. 33-37 (2015).

Luong, J.H.T. et al., "Boron-doped diamond electrode: synthesis, characterization, functionalization and analytical applications", Analyst, 134, pp. 1965-1979 (2009).

Nemanich, R.J. et al., "CVD Diamond—Research, applications and challenges", MRS Bulletin, vol. 39, pp. 490-494 (2014).

Ohtani, R. et al., "Large improvement of phosphorus incorporation efficiency in n-type chemical vapor deposition of diamond", Applied Physics Letters 105, 232106 (2014).

Pinault-Thaury, M.-A., et al., "n-Type CVD diamond: Epitaxy and doping", Materials Science and Engineering B 176, pp. 1401-1408 (2011).

Pinault-Thaury, M.-A., et al., "Phosphorus donor incorporation in (1 0 0) homoepitaxial diamond: Role of the lateral growth", Journal of Crystal Growth 335, pp. 31-36 (2011).

Schauer, S.N. et al., "Phosphorus incorporation in plasma deposited diamond films", Applied Physics Letters 64, 1094 (1994).

Schwede, J.W. et al., "Photon-enhanced thermionic emission from heterostructures with low interface recombination", Nature Communications 4:1576 (2013).

Schwede, J.W. et al., "Photon-enhanced thermionic emission for solar concentrator systems", Nature Materials 9, pp. 762-769 (2010).

Segev, G. et al., "High performance isothermal photo-thermionic solar converters", Solar Energy Materials & Solar Cells 113, pp. 114-123 (2013).

Smith, J.R. et al., "Thermionic Energy Conversion and Particle Detection Using Diamond and Diamond-Like Carbon Surfaces", PhD Thesis, North Carolina State University, Raleigh, North Carolina (2007).

Stenger, I. et al., "Impurity-to-band activation energy in phosphorus doped diamond", Journal of Applied Physics 114, 073711 (2013).

Sun, T. et al. "Combined visible light photo-emission and low temperature thermionic emission from nitrogen doped diamond films", Applied Physics Letters 99, 202101 (2011).

Sun. T. et al., "Thermally enhanced photoinduced electron emission from nitrogen-doped diamond films on silicon substrates", Physical Review B 90, 121302(R) (2014).

Sun, T., "Combined Photo- and Thermionic Electron Emission from Low Work Function Diamond Films", Phd Thesis, Arizona State University, Tempe, Arizona (2013).

Sun, T. et al., "Thermionic and photon-enhanced emission from CVD diamond and new approaches for energy conversion", International Workshop on Photon-Enhanced Thermionic Emission, Tel Aviv, Israel (2014).

Office Action issued in corresponding U.S. Appl. No. 15/151,295, dated Jul. 22, 2016, 25 pages.

Office Action issued in corresponding U.S. Appl. No. 15/151,295, dated Nov. 14, 2016, 30 pages.

Office Action issued in corresponding U.S. Appl. No. 15/151,295, dated Mar. 29, 2017, 25 pages.

* cited by examiner

PHOSPHORUS DOPED DIAMOND ELECTRODE WITH TUNABLE LOW WORK FUNCTION FOR EMITTER AND COLLECTOR APPLICATIONS

CROSS-REFERENCES TO RELATED APPLICATIONS

This application is based on, claims the benefit of, and incorporates herein by reference in its entirety, U.S. Provisional Application Ser. No. 62/332,338, filed May 5, 2016, and entitled, "Phosphorus doped diamond electrode with tunable low work function for emitter and collector applications."

STATEMENT REGARDING FEDERALLY SPONSORED RESEARCH

This disclosure was made with government support under N00014-10-1-0540 awarded by the Office of Naval Research. The government has certain rights in the disclosure.

BACKGROUND

Low work function electrodes are highly sought after as they can significantly advance and enable technologies that rely on electron transfer in devices such as electron sources for communications and in particular direct energy converters that transform heat into electricity without mechanically moving components. Electron sources utilizing thermionic electron emitters are widely deployed in high power/high frequency communications (travelling wave tubes, TWT's), radar, free electron lasers, directed energy weapons, X-ray sources and space propulsion. Conventional electron sources based on metallic cathodes operate at temperatures exceeding 1000° C. Lowering the operating temperature would lead to a less involved design, a reduced power demand, and a lighter and smaller payload for operation in mobile terrestrial and satellite applications.

Thermionic energy converters operate through the generation of an electron emission current from a thermionic electron emitter or cathode which is held at a temperature optimized for its emission barrier or work function, typically in excess of 1000° C. for refractory metal based emitters. A second lower work function electrode is coupled to the thermionic emitter, through a small vacuum gap, which establishes a configuration that can generate electrical power. The efficiency can then directly be related to the work function of the counter-electrode, the collector, where an ideal value of 0.5 eV was reported. This ultra-low work function would enable predicted efficiencies greater than 50%. To achieve a similar efficiency with solid-state thermoelectric conversion would require a material with ZT~10. However, the current best materials exhibit ZT~2. It is notable that traditional thermal power plants can be characterized as operating with ZT~3. Additionally, establishing a means to control the electrode work function would enable devices to operate with optimum performance at the desired temperature.

SUMMARY

According to a first aspect, an apparatus is provided. The apparatus includes a collector including a phosphorus doped diamond layer. The apparatus further includes a thermionic emitter and a vacuum gap disposed between the emitter and the collector. The collector has a work function of 0.84 eV or less.

According to a second aspect, a method is provided for making an apparatus. The method may include one or more of the following acts: preparing a substrate using a wet-chemical cleaning procedure; loading the substrate into a plasma enhanced chemical vapor deposition (PECVD) reactor and prepare a surface of the substrate for doped diamond growth; exposing the substrate to a pure hydrogen plasma for a preset duration; and depositing a phosphorus doped diamond layer on the substrate.

It is to be understood that both the foregoing general description and the following detailed description are exemplary and explanatory only and are not restrictive.

DETAILED DESCRIPTION OF THE DISCLOSURE

Figure 1:
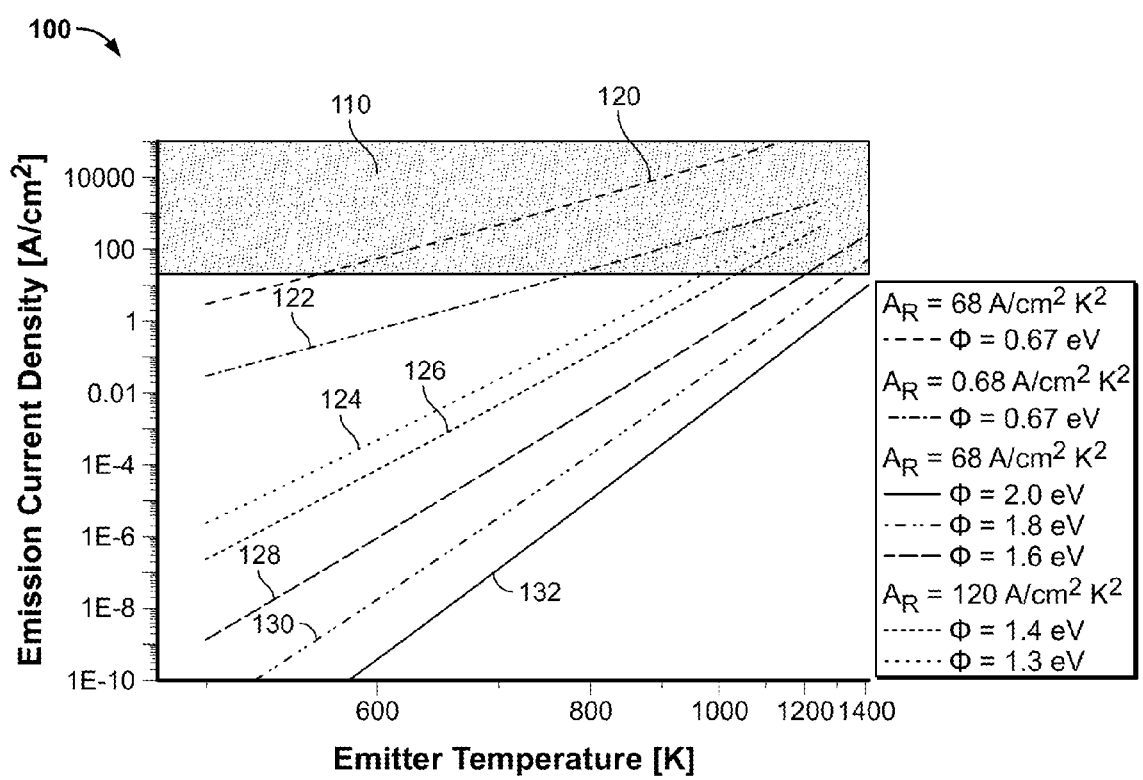
FIG. 1 illustrates simulation results of the electron emission current using the Richardson-Dushman expression for various work functions φ according to an aspect of the disclosure.

Before the present disclosure is described in further detail, it is to be understood that the disclosure is not limited to the particular embodiments described. It is also to be understood that the terminology used herein is for the purpose of describing particular embodiments only, and is not intended to be limiting. The scope of the present disclosure will be limited only by the claims.

As used herein, the singular forms "a", "an", and "the" include plural embodiments unless the context clearly dictates otherwise.

Specific structures, devices, and methods relating to thermionic and solar energy conversion have been disclosed. It should be apparent to those skilled in the art that many additional modifications beside those already described are possible without departing from the inventive concepts. In interpreting this disclosure, all terms should be interpreted in the broadest possible manner consistent with the context. Variations of the term "comprising" should be interpreted as referring to elements, components, or steps in a non-exclusive manner, so the referenced elements, components, or steps may be combined with other elements, components, or steps that are not expressly referenced. Embodiments referenced as "comprising" certain elements are also contemplated as "consisting essentially of" and "consisting of"

those elements. If a series of numerical ranges are recited, this disclosure contemplates combinations of the lower and upper bounds of those ranges that are not explicitly recited. For example, if a range between 1 and 10 or between 2 and 9 is recited, this disclosure also contemplates a range between 1 and 9 or between 2 and 10.

Diamond based electrodes are a preferred material for electron sources in general and energy conversion in particular as the material exhibits excellent high temperature stability, mechanical properties exceeding that of the hardest metals and exceptional resistance to radiation. Additionally, with its high thermal conductivity and electron mobility and the ability to accept shallow donors in its lattice, a diamond based electrode may overcome limits seen with conventional materials.

Low and ultra-low work function doped diamond electrodes were prepared by deposition of a thin phosphorus doped diamond layer on single crystal nitrogen doped, high-pressure, high-temperature (HPHT) substrates through epitaxial layer growth using plasma enhanced chemical vapor deposition (PECVD). The nitrogen doped single crystal substrate allows electrical conduction that improves with temperature suitable for electron sources operating at elevated temperatures. Prior to diamond deposition the surface is cleaned by a wet-chemical procedure including H2SO4, H2O2, NH4OH and HF followed by exposure to a pure hydrogen plasma at a higher temperature to prepare a clean surface. Utilizing hydrogen (H2) as carrier gas, methane (CH4) as carbon source and a phosphorus source, here a 200 ppm trimethylphosphine/hydrogen (TMP/H2) gas mixture, a thin phosphorus doped layer is deposited by establishing a short growth period typically timed for 7 minutes. Optionally, a finishing step in a pure hydrogen plasma establishes a hydrogen passivated surface that induces a negative electron affinity (NEA) characteristic and allows further lowering of the work function or emission barrier.

The devices characterized with respect to the thermionic emission law of Richardson-Dushman indicated an ultra-low work function of 0.67 eV. This is the one of the lowest work functions reported and the lowest work function material operating at temperatures exceeding 800° C. Adjustment of growth conditions enabled tuning of the work function value where a readily achieved alternate deposition regime achieved a work function of 0.84 eV.

FIG. 1 illustrates simulation of the electron emission current using the Richardson-Dushman expression for various work functions φ. The results are presented for three different values of the Richardson constant, the theoretical value for metals ($A_R$=120 A/cm$^2$K$^2$), the theoretical value for diamond ($A_R$=68 A/cm$^2$K$^2$) and the diamond value reduced by a factor of 100 that reflects the range of anticipated experimental values. The upper region 110 presents an emission current density >20 A/cm$^2$ that would compete with or surpass the present emitter technology. Moderate work function metals of 1.3-1.4 eV with the theoretical Richardson constant of 120 A/cm$^2$K$^2$ may provide higher current densities at higher temperatures. Here, line 120 illustrates the change of emission current density values as the emitter temperature increases when the $A_R$ is the theoretical value (68 A/cm$^2$K$^2$) for diamond and the work function is 0.67 eV. Line 122 illustrates the change of emission current density values as the emitter temperature increases when the work function is 0.67 eV and the $A_R$ is one hundredth the theoretical value (0.68 A/cm$^2$K$^2$) for diamond as an example when $A_R$ deviates to lower values In FIG. 1, line 124 illustrates the change of emission current density values as the emitter temperature increases when the $A_R$ is the theoretical value for metals and the work function is 1.3 eV. Line 126 illustrates the change of emission current density values as the emitter temperature increases when the $A_R$ is the theoretical value for metals and the work function is 1.4 eV. Line 128 illustrates the change of emission current density values as the emitter temperature increases when the $A_R$ is the theoretical value for diamond and the work function is 1.6 eV. Line 130 illustrates the change of emission current density values as the emitter temperature increases when the $A_R$ is the theoretical value for diamond and the work function is 1.8 eV. Line 132 illustrates the change of emission current density values as the emitter temperature increases when the $A_R$ is the theoretical value for diamond and the work function is 2.0 eV.

Figure 2:
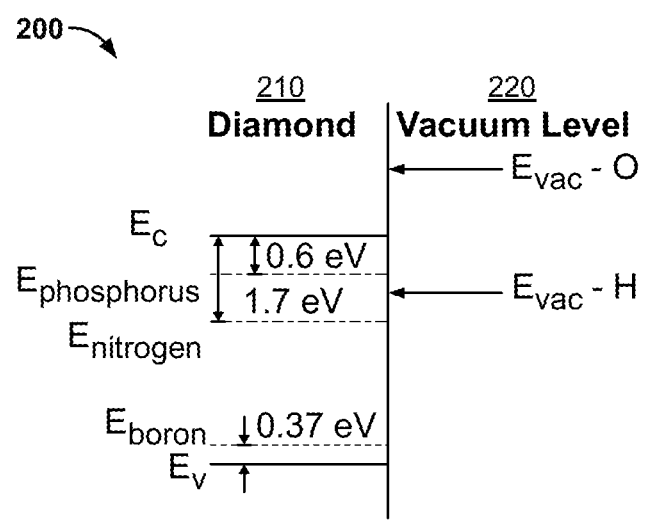
FIG. 2 illustrates a band diagram according to an aspect of the disclosure.

FIG. 2 illustrates a band diagram 200 in a flat band configuration for diamond 210 indicating the donor states for nitrogen, and phosphorus and the acceptor states for boron which reside between the valence, EV, and conduction band, EC. The vacuum level 220 for a hydrogen terminated and oxygen terminated surface is marked, which corresponds to a negative electron affinity (NEA) and a positive electron affinity (PEA), respectively.

Figure 3:
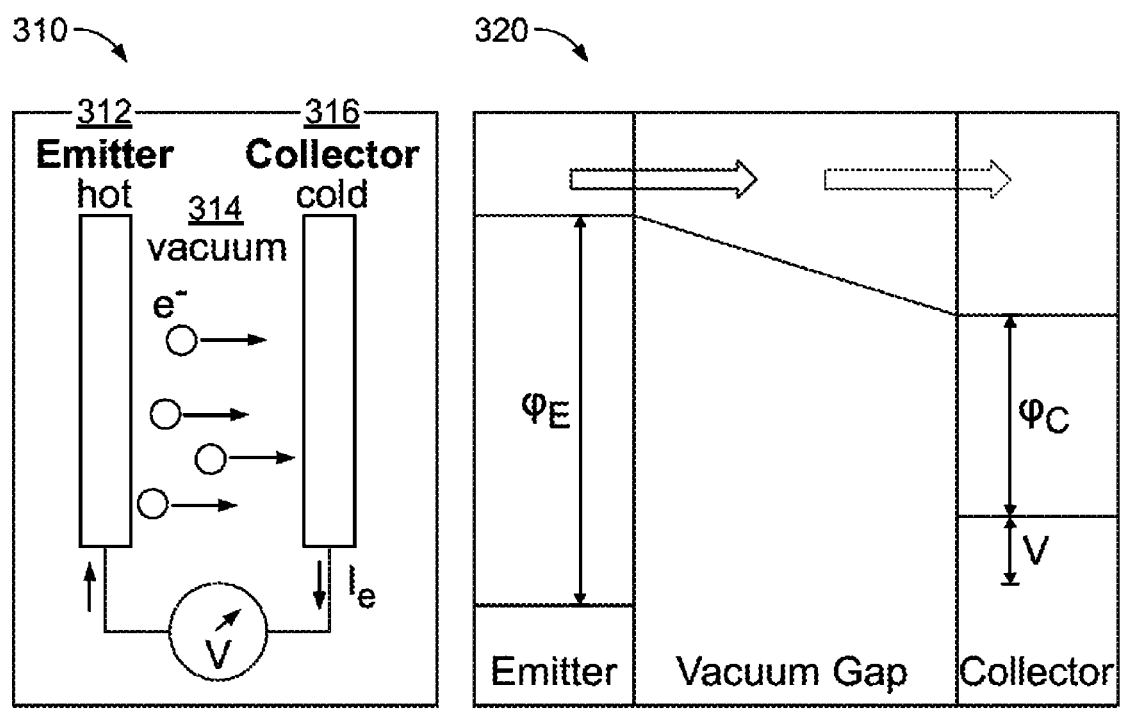
FIG. 3 illustrates an example vacuum thermionic energy converter device according to an aspect of the disclosure.

FIG. 3 illustrates a vacuum thermionic energy converter device 310 comprised of a thermionic electron emitter 312, a vacuum gap 314, and a collector 316 (left image). The corresponding band schematic 320 indicates emitter and collector work function, $\varphi_E$ and $\varphi_C$, respectively, and the self-generated voltage, V, due to the work function difference. The thermionic electron emitter 312 may include a N-doped single crystal diamond. The collector 316 may include a phosphorus doped diamond layer. The phosphorus doped diamond layer may be a P-doped homoepitaxial diamond layer.

Figure 4:
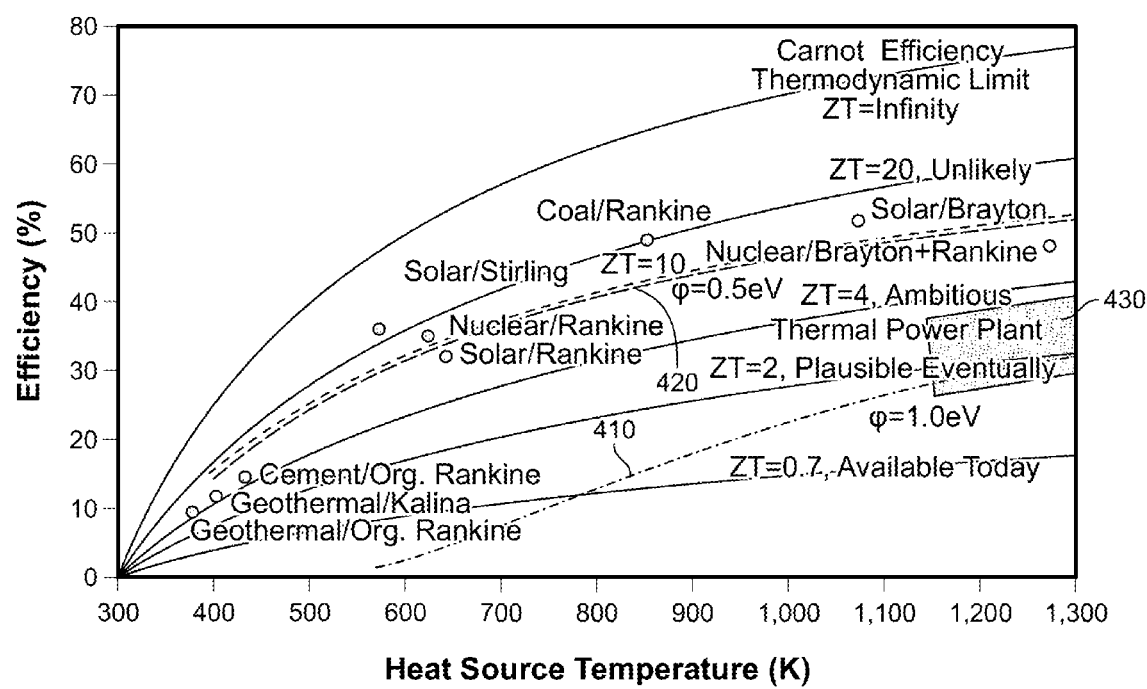
FIG. 4 illustrates conversion efficiency for various power generators in comparison with the thermo-electric ZT figure of merit and the corresponding efficiency of a vacuum-thermionic converter with collector work function φ of 1 eV and 0.5 eV.

FIG. 4 illustrates conversion efficiencies for various power generators in comparison with the thermo-electric ZT figure of merit and the corresponding efficiency of a vacuum-thermionic converter with collector work function φ of 1 eV (line 410) and 0.5 eV (line 420). The feasibility of higher ZT values is indicated. The ZT value for different power conversion processes are indicated as is the operation of thermal power plants (yellow region 430).

Figure 5:
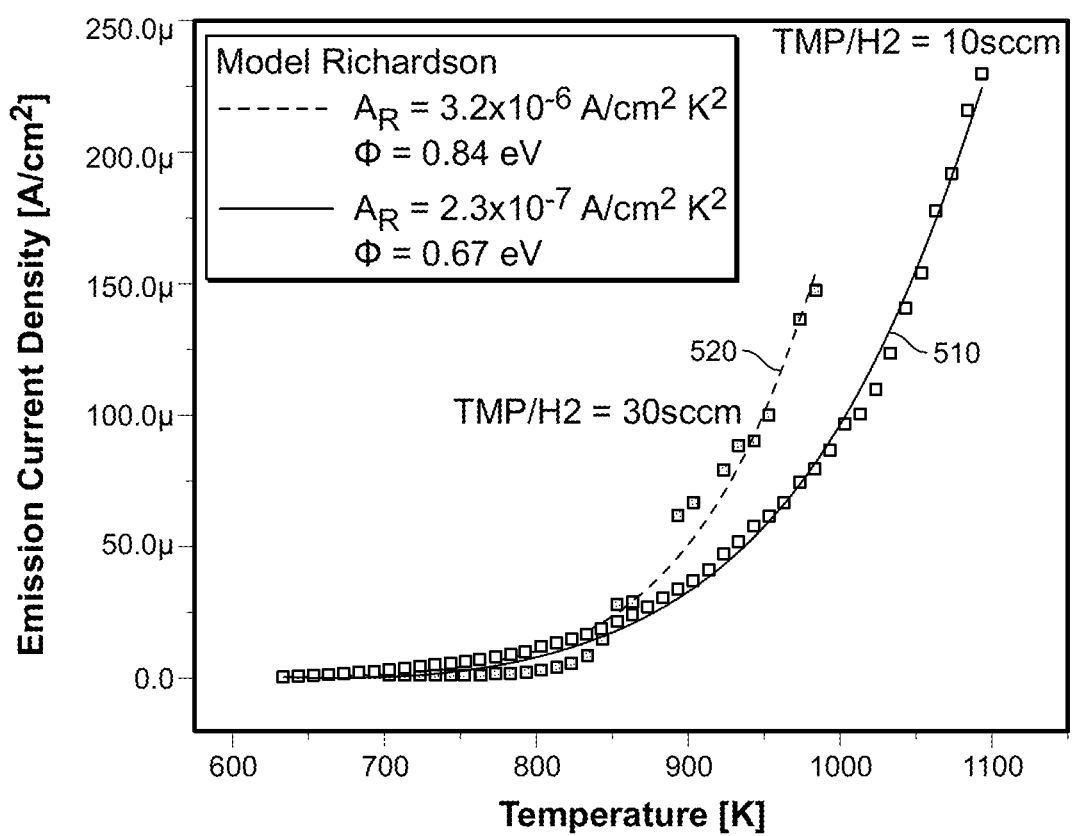
FIG. 5 illustrates thermionic emission vs temperature for samples with an epitaxial phosphorus doped diamond layer on nitrogen doped single crystal diamond (100) substrates according to an aspect of the disclosure and the work function (phi) extracted from a fit to the Richardson formalism.

FIG. 5 illustrates thermionic emission vs. temperature for samples with an epitaxial phosphorus doped diamond layer on nitrogen doped single crystal diamond (100) substrates. The phosphorus doped diamond films were grown with 10 sccm TMP/H2 (curve 510) and 30 sccm TMP/H2 (curve 520). An ultra-low work function of 0.67 eV was deduced from the Richardson relation for the film grown with 10 sccm TMP/H2. An increase of the work function to 0.84 eV was observed for the film grown with a 30 sccm TMP/H2 flow rate. (The solid lines present a fit to the Richardson-Dushman expression.)

Figure 6:
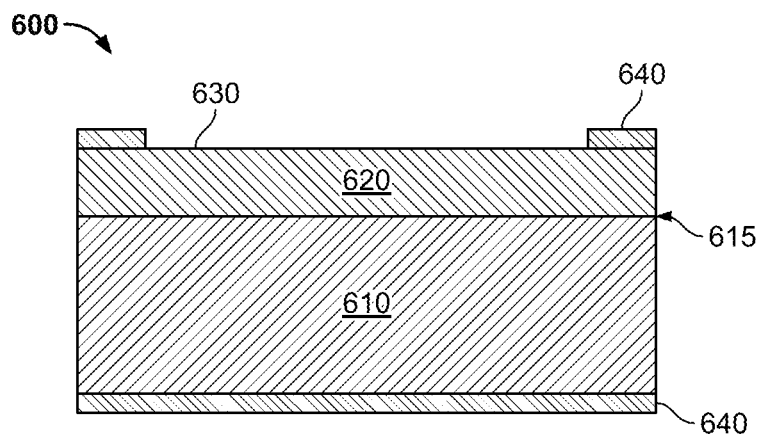
FIG. 6 illustrates a schematic of the doped diamond electrode device according to an aspect of the disclosure.

FIG. 6 illustrates a schematic of the low work function doped diamond electrode device 600 according to an aspect of the disclosure. In FIG. 6, the electrode device 600 may include the conducting (doped) single crystal diamond substrate 610 with (100) or similar orientation (nitrogen doped single crystal, high-pressure, high-temperature (HPHT) or CVD diamond) with a prepared surface (the controlled interface 615); the thin (5 nm-100 nm) phosphorus doped diamond layer 620 with varying and controlled doping concentration and with diamond surface 630 generated by optional surface treatment to induce negative electron affinity properties (hydrogen passivation). Electrical contacts 640 are prepared using metallic (gold) or conducting, doped nano-structured diamond conductors Electron Sources—Introduction:

Thermionic electron sources are an integral part in today's advanced terrestrial and space based telecommunications through travelling wavetubes (TWT's), space exploration through propulsion and energy generators, national security through radar and directed energy weapons, science, health care and industry through electron microscopy, free electron lasers, X-ray sources, electron beam lithography and microwave generators. While each application group requires specifics for operation a common criterion is the power requirement to establish necessary output levels. As the power requirements are directly related to the device (cathode) operating temperature, establishing efficient emission at a lower temperature would translate into a refined system design and reduced power consumption. This becomes more critical for mobile or space applications where part of the payload needs to address power generation. To account for the increased power requirements in satellites which range from 1 kW to 25 kW, silicon based solar panels are being replaced by triple-junction InGaP/InGaAs/Ge solar cells with a conversion efficiency of about 30%. As satellites present relay stations for terrestrial communications via travelling wave tubes, the impact of improved electron sources may be significant. Likewise, it is apparent that more efficient power sources are necessary for space communications and exploration. In fact, electrical power for the Mars Curiosity rover is supplied by a multi-mission radio-isotope thermo-electric generator (MMRTG) utilizing a 2000 W thermal power heat source that is converted by thermo-electrics to about 120 W electrical power in a bulky configuration measuring 25 in. in diameter (fin tip to fin tip), 26 in. in length and weighing about 94 lbs.

Increasing demand for high power/high frequency communications (THz) can be achieved by novel cathodes capable of delivering high current densities. For current TWTs the cathodes are typically heated to 1100° C. and electrons are extracted via thermionic emission and the application of a high voltage. The cathode voltage can range from thousands to hundreds of thousands of volts and establish cathode currents greater than 10 A which requires a cathode material capable of the high emission current densities.

Physics of Thermionic Electron Emission:

Vacuum thermionic electron emission, first formulated by Richardson-Dushman, relates the emission current density $J(T)$ to the emission barrier or work function $\varphi$ and the Richardson or emission constant $A\_R$ through the expression $$J(T) = A\_R * T^2 e^{(-\varphi/(k\_B*T))} \quad (1)$$

where $$A\_R = (4\pi m\_0 * k\_B^2 * e^2)/h, \quad (2)$$

with Boltzmann's constant, $k\_B$, electron effective mass, $m0$, electronic charge, $e$, and Planck's constant $h$. For diamond a value for $A\_R$ of 68 A/cm2K2 was reported. A simulation of (1) is shown in FIG. 1) for various work function values. The plot shows the expected current density that may be obtained from a low work function of 0.6 eV emitter where $A\_R$ ranges from 68-0.68 A/cm2K2. With $\varphi=0.6$ eV and $A\_R=0.68$ A/cm2K2 the cathode is able to provide a current density of ~20 A/cm2 at around 500° C. surpassing any present emitter technology. Some of the lowest work functions have been reported for Ba—Ca—Al oxides. One report of 12-CaO 7-Al2O3 (C12 A$_7$) indicates a work function of 0.6 eV. However, thermionic applications are apparently limited to temperatures less than 500° C. More importantly, for single crystal C12 A$_7$, a shift in the work function to 2.1 eV was observed at a higher temperature regime up to 950° C. which limits use for most energy conversion and communication applications.

Diamond as Electron Emitter:

Considering diamond for electron emitter applications requires evaluation of its band structure that is schematically drawn in FIG. 2. Here, the doping levels are indicated for a flat band configuration, for donor levels of nitrogen at 1.7 eV below the conduction band minimum (CBM) and phosphorus at 0.6 eV below the CBM. A unique band configuration arises when the diamond surface is terminated by hydrogen. In this case the vacuum level is shifted below the CBM eliminating a surface barrier for electron emission. Thermal promotion of electrons from shallow states into the CBM would then allow their unhindered release into vacuum. For clean and oxygen terminated surfaces the vacuum level is positioned above the CBM establishing a positive electron affinity (PEA) surface. Oxygenated and clean diamond surfaces with various orientations were reported with PEA values ranging from 0.6 eV to 1.45 eV. In conjunction with shallow donors, PEA doped diamond surfaces can provide work functions less than 2 eV suitable for emitter applications.

Ultra-low work function diamond as collector electrode for direct energy conversion: The direct conversion of heat into electricity by means of vacuum thermionic energy conversion presents an approach for electrical power generation where high conversion efficiencies are feasible as hot and cold side of the generator is separated by a vacuum gap (see FIG. 3). A vacuum thermionic converter is comprised of a hot side, a thermionic electron emitter and a vacuum gap providing a thermal barrier to the counter-electrode, the collector. This is contrasted by solid-state thermo-electric conversion techniques that rely on materials with low thermal conductivity to establish a sufficiently large thermal gradient between the hot and cold side. The conversion efficiency is typically described by the ZT value where the best current materials exhibit a ZT of about 2 which is reduced to about 1.5 for operating temperatures greater than about 700K. As a comparison, the efficiency of today's thermal power plants would correspond to a ZT value of about 3 and is shown in a comprehensive plot for various heat engines (see FIG. 4). For vacuum thermionic energy conversion a similar figure of merit can be related to the collector work function, and its relation to thermo-electric ZT values is displayed in the efficiency plot in FIG. 4.

Engineering of Low Work Function Doped Diamond Cathodes:

One of the focus of this disclosure is on the preparation of an ultra-low work function collector that can also act as a thermionic emitter or cathode. As electron emitters have to support the electron current across the device an electrically conducting diamond substrate, here, a nitrogen doped, single crystal, high-pressure, high-temperature substrate with (100) surface orientation was selected. These substrates were characterized at elevated temperatures where a Richardson constant $A\_R$ of 62 A/cm2K2 was observed, a value approaching the theoretical value for diamond of 68 A/cm2K2. This established the capability of doped diamond to enable high values for the emission or Richardson constant crucial for efficient thermionic emitters. Preparation of the low work function collector and emitter device commenced with a wet-chemical cleaning procedure that consisted of:

Boil in H2SO4/H2O2/H2O, 3:1:1 at 220° C. for 15 min
HF treatment for 5 min
Boil in NH4OH/H2O2/H2O, 1:1:5 at 75° C. for 15 min
rinse with DI water after each step The thus prepared substrate was then loaded into the PECVD reactor and exposed to a pure hydrogen plasma at 800° C.-900° C. for 15 min. This process prepares the surface for the doped diamond growth. A thin phosphorus doped diamond layer was then deposited using a methane flow rate of typically 2 sccm (0.5% of the total gas flow) and a 200 ppm trimethylphosphine/hydrogen (the phosphorus source) flow rate between 10 sccm and 30 sccm with hydrogen as carrier gas with a total gas flow rate of 400 sccm. The phosphorus doped layer is deposited at around 900° C.-1000° C. using a microwave power of 2500 W and a chamber pressure of 75-85 Torr. With these growth conditions and by utilization of plasma focusing geometry of the sample holder, heating of the substrate is achieved by the plasma discharge. Furthermore, a water-cooled sample stage and PECVD reactor reduce incorporation of impurities during deposition. The growth period is timed for about 7 minutes after which methane and TMP/H2 flow is terminated and the sample cooled under hydrogen plasma exposure which induces a negative electron affinity surface. Results from two devices are presented here, where the TMP/H2 flow rate was established at 10 sccm and 30 sccm. The average thicknesses of the films are estimated to be between 5 nm and 100 nm, and the layer thickness can be further optimized to achieve a low resistivity and work function.

Thermionic Emitter Characterization:

To prepare the collector and thermionic cathode, electrical contacts are prepared using a thin gold layer on the top surface as well as the backside of the substrate (see FIG. 6). In an emission characterization chamber, a bias voltage is applied to the device to overcome space charge effects, and the emission current is recorded as a function of temperature as shown in FIG. 5. For the sample prepared with 10 sccm of TMP/H2 an ultra-low work function of 0.67 eV was extracted from a fit to the Richardson expression. As the TMP/H2 flow rate is increased to 30 sccm, the work function was observed to increase to 0.84 eV. The devices were operated at temperatures up to 950° C. indicating high temperature stability of the device.

A novel device structure based on doped diamond has been developed where a donor state establishes a surface with a low work function that can be further reduced through suitable surface terminations. This device can provide a work function as low as 0.67 eV where the operating temperature exceeds 800° C. The cathodes are readily prepared on (100) oriented single crystal diamond substrates a preferred crystallographic orientation for device manufacturing. Tuning the value of the work function was achieved by adjusting the growth parameters. With a modified growth regime a cathode with a work function of 0.84 eV was engineered. These low work function thermionic electron emitters may advance high power/high frequency telecommunications, as well as applications where electron sources may be a key component. Secondly, in direct energy conversion application of the low work function electrode as collector conversion efficiencies approaching 50% may be realized.

Thin layers of phosphorus doped diamond with controlled doping concentration on (100) single crystal nitrogen doped diamond that allow preparation of ultra-low work function collectors and thermionic emitters with tunable work function.

The phosphorus doped diamond collector/emitter with a work function of 0.67 eV presents the only known material that can maintain this low emission barrier across a wide temperature regime which has been measured up to 950° C. Additionally, we have established a means to control the work function by adjusting the phosphorus doping, where a variation of the work function to 0.84 eV was demonstrated. The low work function is achieved without adsorbates or coatings.

Diamond based electrodes are a preferred material for electron sources in general and energy conversion in particular as the material exhibits excellent high temperature stability, mechanical properties exceeding that of the hardest metals and exceptional resistance to radiation. Additionally, with its high thermal conductivity and electron mobility and the ability to accept shallow donors in its lattice, a diamond based electrode may overcome limits obtainable by conventional materials.

Low and ultra-low work function doped diamond electrodes were prepared by deposition of a thin phosphorus doped diamond layer on single crystal nitrogen doped, high-pressure, high-temperature (HPHT) substrates through epitaxial layer growth using plasma enhanced chemical vapor deposition (PECVD). The nitrogen doped single crystal substrate allows electrical conduction that improves with temperature suitable for electron sources operating at elevated temperatures. Prior to diamond deposition the surface is cleaned by a wet-chemical procedure including H2SO4, H2O2, NH4OH and HF followed by exposure to a pure hydrogen plasma at a higher temperature to prepare a clean surface. Utilizing hydrogen (H2) as carrier gas, methane (CH4) as carbon source and a phosphorus source, here a 200 ppm trimethylphosphine/hydrogen (TMP/H2) gas mixture, a thin phosphorus doped layer is deposited by establishing a short growth period typically timed for no more than 7 minutes. Optionally, a finishing step in a pure hydrogen plasma establishes a hydrogen passivated surface that induces a negative electron affinity (NEA) characteristic and allows further lowering of the work function or emission barrier.

The disclosed devices may be characterized with respect to the thermionic emission law of Richardson-Dushman and indicated an ultra-low work function of 0.67 eV. This is one of the lowest work functions reported and the lowest work function material operating at temperatures exceeding 800° C. Adjustment of growth conditions may be enabled by tuning of the work function value where a readily achieved alternate deposition regime achieved a work function of 0.84 eV.

The disclosure also provides a low work function electrode as a thermionic electrode emitter that utilizes shallow diamond donors such as phosphorus. The disclosed devices may include thermionic cathodes and may be employed in a wide variety of applications. The low work function electrode may include a negative electron affinity surface for ultra-low work function electrodes, a positive or zero electron affinity for a low work function where the ultra-low work function of the negative electron affinity surface is increased by the value of the electron affinity (typically 1 eV). The low work function electrode has a reduced upward band bending and a thin 5-100 nm thin phosphorus doped diamond layer. The low work function electrode can enable efficient energy conversion devices.

Although the invention has been described in considerable detail with reference to certain embodiments, one skilled in the art will appreciate that the present invention may be practiced by other than the described embodiments, which have been presented for purposes of illustration and not of limitation. Therefore, the scope of the appended claims should not be limited to the above description contained herein.

What is claimed is:

1. An apparatus comprising:
   a thermionic electron emitter;
   a collector electrode comprising a phosphorus doped diamond layer; and
   a vacuum gap disposed between the emitter and the collector,
   wherein the collector has a work function of 0.84 eV or less.

2. The apparatus of claim 1, wherein the phosphorus doped diamond layer has a thickness between 5 nm and 100 nm.

3. The apparatus of claim 1, wherein the collector work function is no greater than 0.67 eV.

4. The apparatus of claim 1, wherein the phosphorus doped diamond layer comprise a diamond upper surface disposed under at least one electrical contact.

5. The apparatus of claim 1, wherein the collector further comprise a diamond substrate disposed under the phosphorus doped diamond layer.

6. The apparatus of claim 5, wherein the collector further comprises a controlled interface disposed directly between the phosphorus doped diamond layer and the diamond substrate.

7. The apparatus of claim 5, wherein the diamond substrate comprises a nitrogen doped single crystal diamond substrate.

8. The apparatus of claim 5, wherein the diamond substrate comprises a nitrogen doped, single crystal, high-pressure, high-temperature or chemical vapor deposition (CVD) substrate with (100) surface orientation.

9. The apparatus of claim 8, further comprising electrical contact in direct contact with the diamond substrate, wherein the thermionic electron emitter comprises a phosphorus doped diamond layer.

* * * * *